United States Patent [19]

Weiner et al.

[11] 4,370,597
[45] Jan. 25, 1983

[54] THYRATRON SWITCH FOR NARROW PULSES

[75] Inventors: Maurice Weiner, Ocean City; William Beattie, Rumson, both of N.J.

[73] Assignee: The United States of America as represented by the Secretary of the Army, Washington, D.C.

[21] Appl. No.: 224,603

[22] Filed: Jan. 12, 1981

[51] Int. Cl.³ .............................................. H03K 3/55
[52] U.S. Cl. .................................... 315/58; 307/108; 315/241 R; 315/326; 328/67
[58] Field of Search ............. 315/58, 71, 240, 241 R, 315/326, 349; 313/193, 197, 313, 324; 307/98, 108; 328/67, 210, 250; 332/8, 9 R

[56] References Cited

U.S. PATENT DOCUMENTS 3,071,710 1/1963 Fischer .......................... 328/67 X
3,649,864 3/1972 Willemsen ..................... 315/58 X Primary Examiner—Eugene R. La Roche
Attorney, Agent, or Firm—Nathan Edelberg; Jeremiah G. Murray; Edward Goldberg

[57] ABSTRACT

Narrow pulse modulation (less than four nanoseconds) of millimeter wave tubes will enable radar systems to achieve improved pattern recognition. The modulator has an outer cylindrical return shield surrounding a tetrode thyratron. An inner cylindrical shield connected to the anode provides capacitive energy storage for generating the output pulse when the control grid is triggered. The anode is connected via only a resistance to the direct current supply.

7 Claims, 6 Drawing Figures

THYRATRON SWITCH FOR NARROW PULSES

The invention described herein may be manufactured and used by or for the Government for governmental purposes without the payment of any royalties thereon or therefor.

BACKGROUND OF THE INVENTION

This invention relates to a thyratron switch for producing pulses having a very narrow width, and more particularly to generation of narrow pulses for modulation of millimeter wave tubes.

Narrow pulse modulation of millimeter wave tubes is required in order to achieve improved pattern recognition and resolution in radar systems. The required modulation characteristics are typically: pulsewidths less than four nanoseconds, pulse repetition rates greater than 20 kilohertz, jitter less than one nanosecond, and pulse amplitudes of 2 to 15 kilovolts (the particular voltage depends on the tube type). For the long term future, such modulators will most likely rely on solid state devices such as avalanche transistors, or possibly pulse sharpening devices. Since the ultimate risetime capability of the solid-state devices is in the subnanosecond range, millimeter wave systems with extremely good resolution are foreseen. Until such devices are developed, however, an interim solution for obtaining narrow pulse modulation appears feasible using conventional thyratrons. Thyratrons satisfy both the voltage and pulse repetition rate requirements, but the risetime capability is marginal. This naturally limits the ability of the thyratron to produce the necessary narrow pulse.

SUMMARY OF THE INVENTION

The object of this invention is to provide a switch capable of meeting all of the requirements for generating narrow pulses for use as a modulator for millimeter wave tubes.

According to the invention, a tetrode thyratron (which includes a keep-alive element) is fitted with inner and outer shields, which provides capacitive energy storage. The inner shield and a charging resistor are connected to the anode. The load is connected between the outer shield and the cathode.

DETAILED DESCRIPTION

The invention covered herein was described by us in an oral presentation entitled "Generation of Nanosecond Pulses With A Thyratron Switch" at the 14th *Pulse Power Modulator Symposium* on June 3, 1980, and published in the Record of the Symposium during August 1980. This paper is hereby incorporated by reference.

Figure 1:
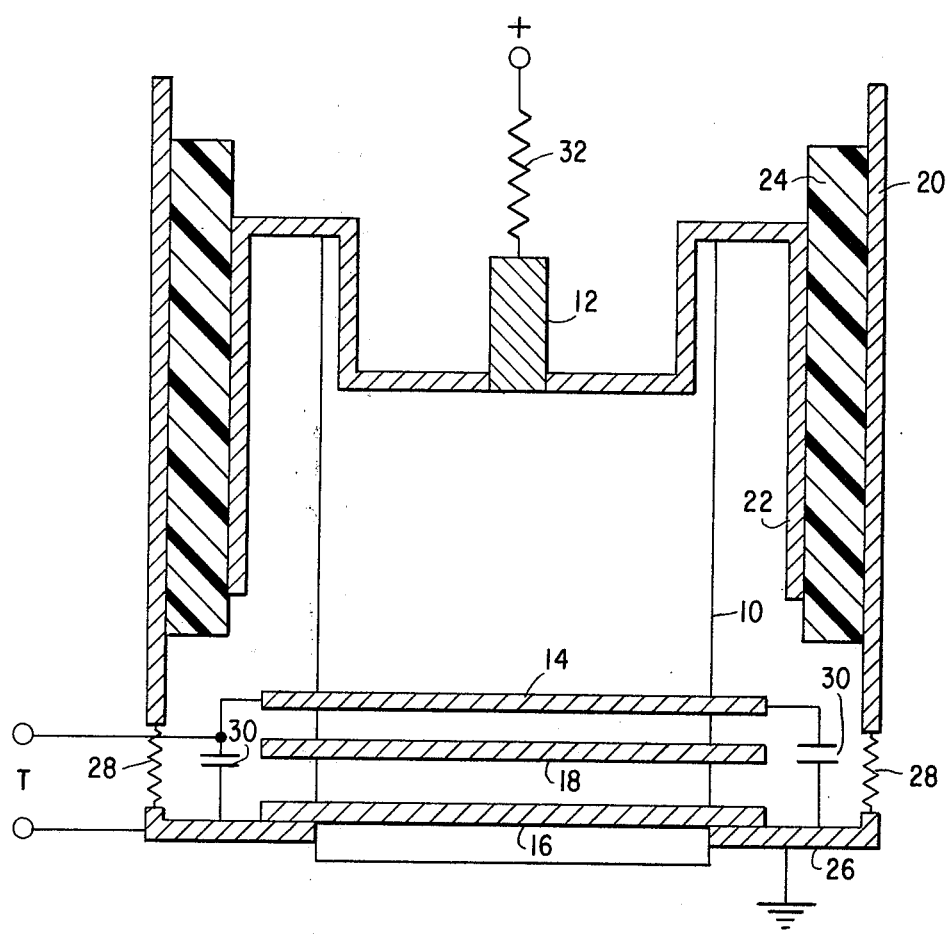
FIG. 1 is a diagramatic view of a thyratron with a coaxial return structure and an inner shield providing capacitive energy storage (not to scale)

Referring to FIG. 1, a commercially available tetrode thyratron 10 is used for the basic switch. Besides the usual anode 12, cathode 16 and control grid 14, the tetrode thyratron also has a keep-alive element 18. Comparison with a triode thyratron having similar ratings shows the tetrode type generally performs better with respect to jitter and anode delay time drift. With this tube the direct current biased keep-alive grid 18, close to the cathode 16, provides a continuous source of ionization. A pulse delivered at input T to the control grid, biased negatively, performs the triggering function. Separate control of the heater and reservoir voltages is provided, thus giving experimental flexibility. In the experimental work an EEV model CX1164 was used, although any type tetrode thyratron is probably suitable. The tube operates with a peak voltage of 12 kilovolts and a peak current of 350 amperes.

An outer shield 20 of coaxial design is used for the current return. For experimental testing, a load is connected between the shield 20 and the grounded base plate 26, which is tied to the cathode 16. The loads tested included purely resistive (50 to 100 ohms) as well as parallel combinations of resistance and capacitance (up to 30 picofarads). The load is distributed symmetrically about the circular shield to reduce load inductance. For most measurements a total of three two-watt resistors 28 in parallel constituted the load. The number of such resistors represented a compromise between connecting too many in parallel (increasing stray capacitance) and connecting too few (causing load inductance to increase). As shown in FIG. 1, a capacitance 30, with low inductance, is connected between the control grid and ground. This capacitance serves to isolate the discharge circuit from the inductive effects of the grid leads.

The energy storage for narrow pulse switching may be accomplished with either a 50-ohm cable or low inductance lumped capacitance connected from the thyratron anode 12 to the outer shield 20. For extremely narrow pulses (less than five nanoseconds) these approaches were found unsatisfactory because of excessive pulse ringing and inefficient voltage transfer to the load (for the most part less than 5% of the source voltage was delivered to the load). Instead of using the aforementioned approaches, a new method of energy storage is introduced. A partial inner shield 22 connected to the anode 12 is added to the structure of FIG. 1. The capacitive energy storage between the inner and outer shields is then utilized. Dielectric 24 (such as that sold under the trademark MYLAR) is inserted between the shields to increase the capacitance (typically to 40 or 50 picofarads). The charging resister 32 from a high voltage direct current source is connected directly to the anode 12.

The outer shield 20 has an inside diameter of 7.6 cm. and is 7.6 cm. long. The inner shield 22 has an outside diameter of 6.35 cm. and is 3.5 cm. long.

Advantages of the Device

The introduction of the inner shield 22 for the thyratron, combined with the other high speed pulse techniques (outer shield, tetrode thyratron, bypass capacitor for grid, etc.) have enabled the production of extremely narrow pulses. Pulses as narrow as four nanoseconds, with considerably reduced ringing and improved voltage transfer have been obtained. Since there are no lumped high voltage capacitors there are no regions with concentrated electric fields. Capacitor failure is eliminated and reliability is enhanced.

Experimental Results

Figure 2:
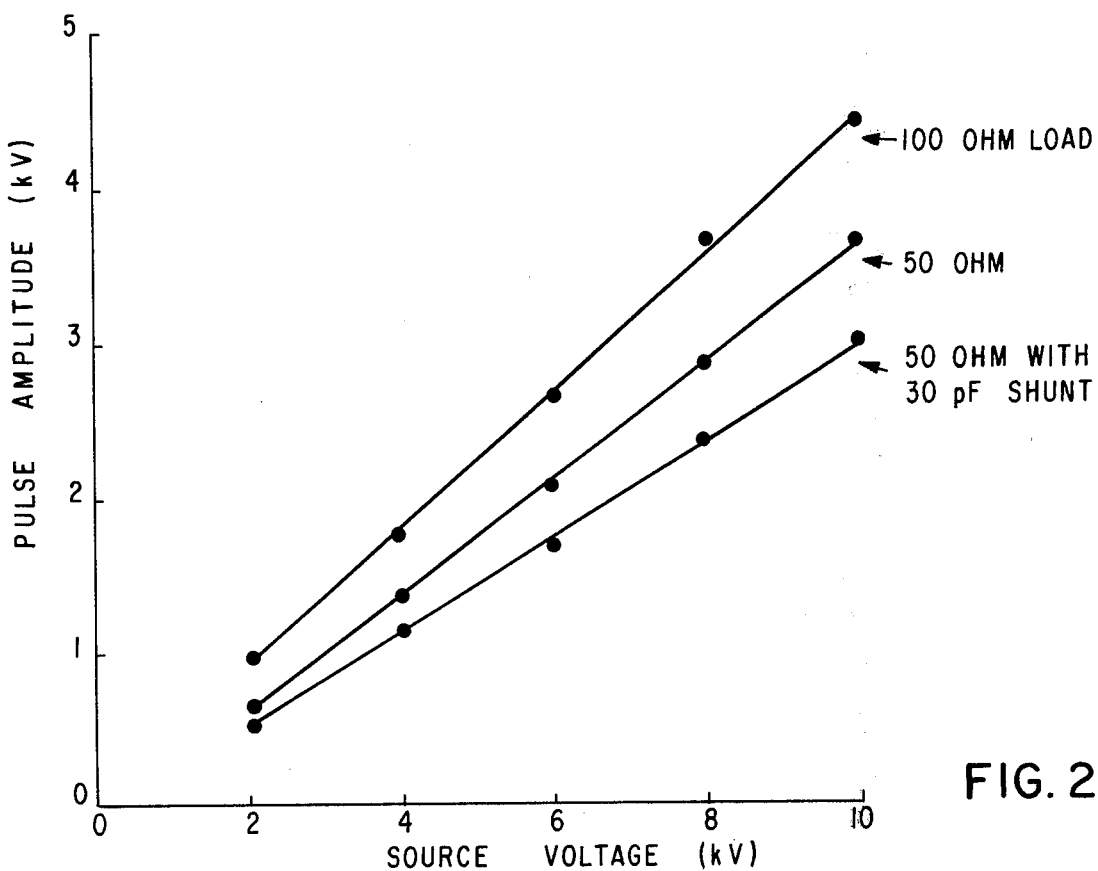
FIG. 2 is a graph showing pulse amplitude versus source voltage for various loads.

The output pulse amplitude as a function of source voltage is shown in FIG. 2 for several cases of interest. The two uppermost curves represent 50 and 100 ohm load resistances with only stray capacitance present. As anticipated smaller voltage transfer occurs at 50 ohms. The remaining curve shows the amplitude for a 50 ohm load with an additional 30 pF shunting the load. The amplitude is further reduced since there is insufficient energy in the delivered pulse to charge the increased capacitance quickly.

Figure 3:
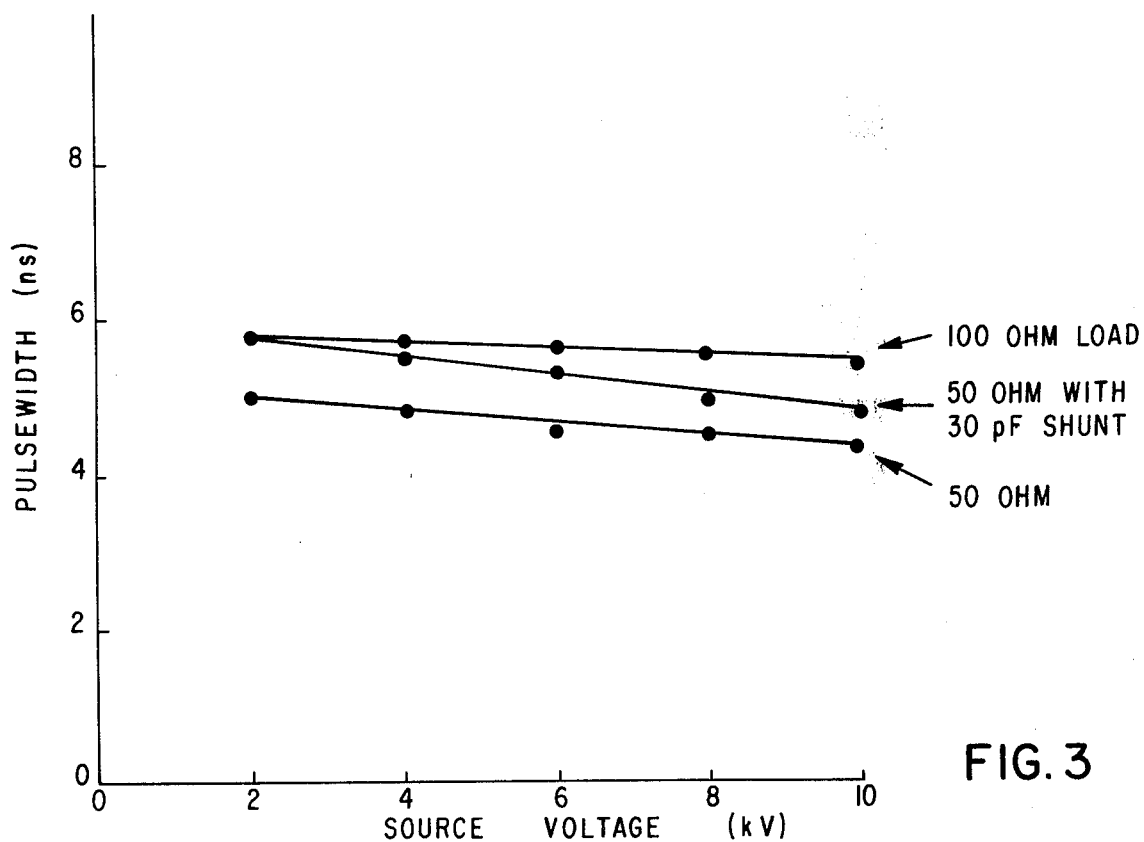
FIG. 3 is a graph showing pulse width versus source voltage for various loads.

FIG. 3 shows the pulsewidth (at 50 percent point) as a function of source voltage for the same cases of interest. Note that with only the stray capacitance present the pulsewidth for the 100 ohm resistance exceeds that for the 50 ohm. This is anticipated since the RC time constant is larger. Thus a longer time is needed for the stray capacitance to charge up, as well as to discharge. Also, note that for the same resistance of 50 ohms the addition of shunt capacitance widens the pulsewidth, as expected.

Figure 4:
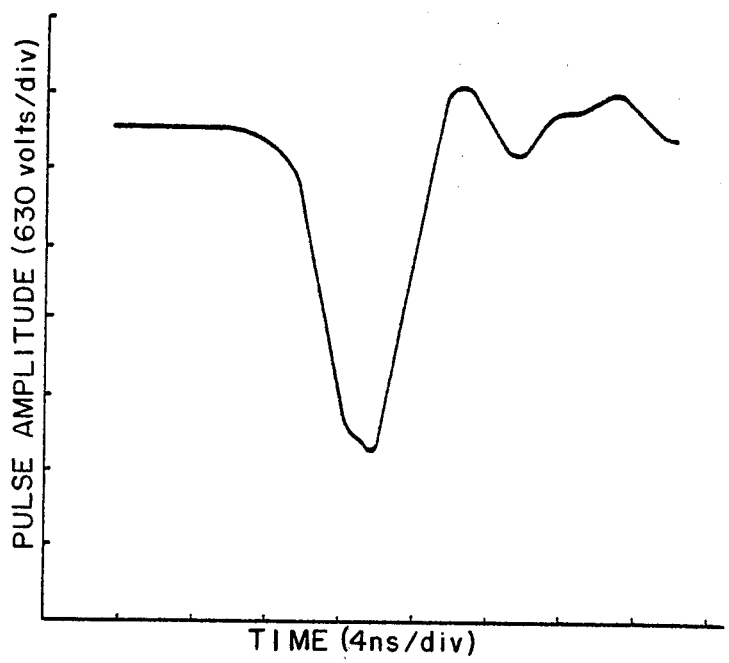
FIG. 4 shows a voltage waveform for a 50-ohm load and a source voltage of 8 kilovolts.
Figure 5:
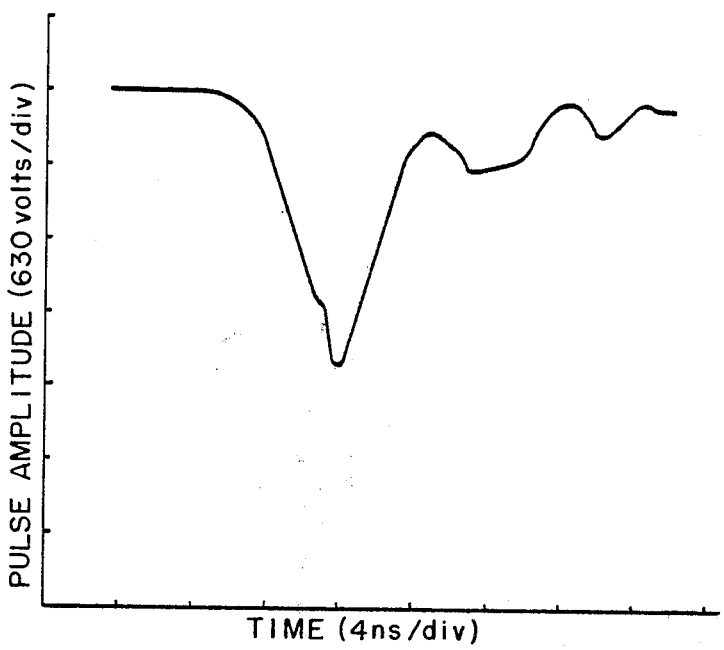
FIG. 5 shows a waveform under the same conditions as FIG. 4, but with additional 30 picoforads across the load.

FIG. 4 shows the output waveform for the 50 ohm load, with only the stray capacitance present. Note that some pulse top flatness (approximately 2 ns wide) may be ascribed to the pulse. Generally, the pulses were more square at the lower voltages. For example, the same pulse top at 4 kV was about 3 ns. The degree of pulse flatness was significantly enhanced by increasing the heater voltage (pulse characteristics were much less affected by keep-alive grid current and reservoir voltage). Aside from pulse flatness the heater voltage also had a strong impact on pulse amplitude. For example, with a constant source voltage of 6 kV the pulse amplitude across a 100 ohm load was 2168 volts at 6.0 volts, and increased to 2835 volts at 7.3 volts. This effect is attributed to voltage drop in the cathode coating which is temperature dependent. Dissipation in the cathode is more prominent for low average power operation, a condition which prevailed during the experiment. In FIGS. 4 and 5 the horizontal scale is 4 nanoseconds/division and the vertical scale is 630 volts/division.

FIG. 5 shows the waveform under the same conditions of FIG. 4 but with an additional 30 pF across the load. Note the obvious fact that the pulse top has disappeared as a result of the increased risetime and falltime.

Application to Millimeter Wave Tubes

The present pulser had direct application to mm wave tubes. They include: extended interaction oscillators and amplifiers (EIO and EIA), magnetrons, and traveling-wave-tubes (TWT). In all these tubes the impedance is similar: roughly 10 to 50 picofarads capacitance (the exact value dependent on the amount of stray) shunted by a fairly large resistance. The resistance is several thousand ohms in the case of the EIO, EIA, and TWT. For the magnetron the resistance is much lower—on the order of several hundred ohms.

By shunting the tube with an external resistance substantially smaller than the tube resistance, no pull-down circuit is required since the shunt quickly discharges the tube capacitance. Energy is dissipated in the added shunt (with a concurrent lowering of efficiency), but this is a penalty one must pay in order to obtain narrow pulse modulation in a simple manner. It should be noted that by adding the 50 ohm shunt to the tube, the impedance level is entirely compatible with the thyratron pulser investigated here. The loads studied provide a reasonably good simulation of the tube impedance (including 50 ohm shunt) since both the resistive and capacitive elements are similar.

Figure 6:
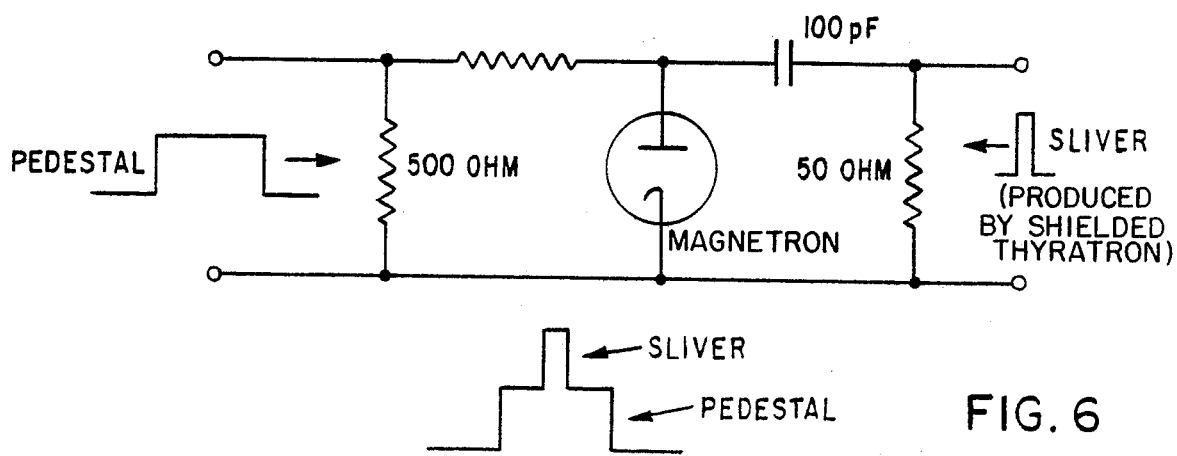
FIG. 6 is a schematic drawing of a pedestal pulse circuit.

FIG. 6 shows a pedestal pulser circuit for using the modulator with a 95 gigahertz (GHz) magnetron, EEV model M5163, operating at peak voltage of 10 kV. As mentioned previously the tube load is a parallel combination of capacitance and a resistance of several hundred ohms. The equivalent resistance, however, is in series with a biased diode, i.e., no substantial current is drawn from the magnetron until a threshold is achieved, roughly 80 percent of the peak voltage. This type of load lends itself to pedestal pulsing techniques. The magnetron is pedestal pulsed, in which the pedestal is an 8 kV pulse, about 50 ns wide. The pedestal is produced by either a magnetic modulator, hard tube, or possibly another thyratron. The narrow pulse (or "silver"), produced by the shielded thyratron, is superimposed on the pedestal to give the required 10 kV.

Conclusions

A tetrode thyratron has been shown to be feasible for narrow pulse modulation of mm wavelength tubes. By properly shielding the thyratron to reduce inductance, kilovolt pulses with pulsewidths as narrow as 4 ns were achieved. Because of the relatively small pulse energies involved it was possible to construct the pulse capacitance as part of the shield design. This eliminated lumped storage capacitors from the discharge circuit, thus simplifying the design. The shielded thyratron also produced pulses with less ringing and generally faster risetime. The present pulser, tested with capacitively shunted loads of 50 and 100 ohms, will be used to modulate a 95 GHz magnetron. For this purpose pedestal pulsing techniques will be employed.

What is claimed:

1. Apparatus for supplying narrow width high voltage modulation pulses to a load, comprising a switch which is a thyratron having anode, grid and cathode electrodes; resistance means connected between the anode electrode and the positive side of a high voltage direct-current source; a connection from the cathode electrode to the negative side of said source; an outer cylindrical shield surrounding said thyratron; said load being coupled between said outer shield and the cathode electrode; an inner cylindrical shield located between said outer shield and the thyratron, with means connecting the anode electrode to the inner shield, to thereby provide capacitive energy storage means between the anode electrode and the outer shield; operative in response to a trigger pulse between the grid and cathode electrodes which causes the thyratron to conduct and thereby produces said narrow width high voltage output pulse at said load.

2. Apparatus according to claim 1, wherein said thyratron is of the tetrode type which includes a keep-alive electrode.

3. Apparatus according to claim 1 or 2, further includ-capacitor means connected between the grid and cathode electrodes.

4. Apparatus according to claim 3, including a dielectric material inserted between said outer shield and said inner shield to increase the capacitance.

5. Apparatus according to claim 1 or 2, wherein said load is an electron tube, and wherein said output pulse is superimposed on a substantially wider pulse forming a "pedestal" from another source.

6. Apparatus according to claim 5, wherein said electron tube is a magnetron.

7. Apparatus according to claim 6, further including capacitor means connected between the grid and cathode electrodes, and including a dielectric material inserted between said outer shield and said inner shield to increase the capacitance.

* * * * *